US012794453B2

(12) United States Patent
Jouanneau

(10) Patent No.: US 12,794,453 B2
(45) Date of Patent: Nov. 10, 2026

(54) TIME SEQUENCE GENERATION DEVICE

(71) Applicant: STMicroelectronics International N.V., Geneva (CH)

(72) Inventor: Thomas Jouanneau, Jarrie (FR)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 19/182,784

(22) Filed: Apr. 18, 2025

(65) Prior Publication Data

US 2025/0343535 A1 Nov. 6, 2025

(30) Foreign Application Priority Data

May 3, 2024 (FR) ....................................... 2404687

(51) Int. Cl.
*H03K 3/03* (2006.01)
*G11C 19/28* (2006.01)
*H03K 3/037* (2006.01)

(52) U.S. Cl.
CPC ........... *H03K 3/0315* (2013.01); *G11C 19/28* (2013.01); *H03K 3/037* (2013.01)

(58) Field of Classification Search
CPC .... H03K 3/0315; H03K 3/037; H03K 5/1502; H03K 5/15093; H03K 5/135; G11C 19/28
See application file for complete search history.

(56) References Cited

U.S. PATENT DOCUMENTS

| | | | | |
|---|---|---|---|---|
| 5,812,626 | A * | 9/1998 | Kusumoto | G06F 1/10 714/E11.155 |
| 6,369,624 | B1 | 4/2002 | Wang et al. | |
| 8,456,203 | B2 | 6/2013 | Kondou | |
| 2003/0095009 | A1 * | 5/2003 | Gomm | H03L 7/087 331/57 |
| 2010/0201409 | A1 | 8/2010 | Terada et al. | |
| 2023/0291395 | A1 | 9/2023 | Jouanneau | |
| 2023/0291396 | A1 | 9/2023 | Chisaka | |

FOREIGN PATENT DOCUMENTS

| | | | |
|---|---|---|---|
| CN | 116760392 | A | 9/2019 |
| FR | 3133458 | A1 | 9/2023 |

OTHER PUBLICATIONS

French Search Report for Application No. 2404687, dated Nov. 21, 2024, 18 pages.

* cited by examiner

*Primary Examiner* — Jeffrey M Shin
(74) *Attorney, Agent, or Firm* — Alston & Bird LLP

(57) ABSTRACT

The present description concerns a device comprising a ring oscillator comprising a plurality of gates, each delivering a fast clock signal. A first shift register comprises a succession of first flip-flops, each synchronized to a same first clock signal corresponding to one of the fast clock signals. The first shift register is looped back on itself and implements a second oscillator where each first flip-flop delivers a slow clock signal. A second shift register comprises a succession of second flip-flops, each synchronized to the same second clock signal corresponding to one of the slow clock signals.

15 Claims, 2 Drawing Sheets

TIME SEQUENCE GENERATION DEVICE

CROSS REFERENCE TO RELATED APPLICATIONS

This application claims the priority benefit of French Patent Application No. 24/04687 filed on May 3, 2024, entitled "Time sequence generation device," which is hereby incorporated by reference to the maximum extent allowable by law.

TECHNICAL FIELD

The present disclosure generally concerns electronic circuits for generating digital time signals.

BACKGROUND

Many types of devices, such as memories or calculators, require digital signals with given time sequences to control actions, to be carried out by these devices and at specific times.

It is known to those skilled in the art to generate such time sequences with a time scale in the order of a few hundred picoseconds by using a microprocessor at an operating frequency of several GHz. This microprocessor generally uses phase-locked loop systems at high frequencies, which implies the use of advanced technologies as well as high manufacturing costs and power consumption. It is further currently difficult to generate such adjustable time sequences without implying a significant development complexity.

To generate such adjustable time sequences, documents FR 3133458, US2023291396, and CN 116760392 describe a device comprising a ring oscillator and a shift register synchronized to a clock signal delivered by one of the logic gates of the ring oscillator.

FIG. 1 is a copy of FIG. 1 of the above-mentioned documents. FIG. 1 schematically shows an example of a time sequence edge generation circuit 100.

According to the example of FIG. 1, time sequence generation circuit 100 comprises a ring oscillator 102. Ring oscillator 102 is formed of a plurality of logic gates 101, 103, 105, 107, 109 coupled in series and to the output of logic gate 109 coupled to the input of logic gate 101, and having its respective output node referred to as CK1, CK2, CK3, CKN−1, CKN. Using number N, which represents the number of logic gates in the oscillator, those skilled in the art will be capable of adjusting their calculations according to the appropriate number of gates. In the example of FIG. 1, the logic gates are, for example, inverters. It is however possible for oscillator 102 to be formed based on other types of logic gates, such as NOR gates or NAND gates.

Oscillator 102 is implemented, for example, by a loop formed of an odd number of inverting logic gates. Although in the example of FIG. 1, five gates are illustrated, it is possible, for example, for the oscillator to be implemented by three logic gates, or also by an odd number of logic gates greater than five. Each logic gate delivers an output clock signal: CK1, CK2, CK3, CKN−1, and CKN.

Output clock signals CK1 to CKN have edges exhibiting time shifts with respect to one another, and by selecting one of these signals, it is thus possible to generate an edge with a given time shift. For example, taking as a first signal signal CK1, signal CK3 is delayed with respect to signal CK1, signal CKN, that is, signal CK5 in the example of FIG. 1, is delayed with respect to signal CK3, signal CK2 is delayed with respect to signal CKN, and signal CKN−1, that is, signal CK4 in the example of FIG. 1, is delayed with respect to signal CK2.

Clock signals CK1, CK2, CK3, CKN−1, and CKN are, for example, coupled to the input of a multiplexer 104 configured to select one or a plurality of signals from among these clock signals. Multiplexer 104 is controlled by a selection signal SEL1 generated by a control unit CMD, 111. The output of multiplexer 104 feeds a clock signal input of a first shift register 110 with a clock signal CK(i) selected from among clock signals CK1 to CKN, with i an integer index ranging from 0 to N−1. In other words, shift register 110 is synchronized to one of signals CK(i).

According to the example of FIG. 1, the first shift register 110 comprises three flip-flops SR1_FLIP_FLOP_1, SR1_FLIP_FLOP_2, SR1_FLIP_FLOP_3 coupled in series. It is however possible to envisage, according to the desired time shift, for shift register 110 to comprise a single flip-flop or two flip-flops, or a number of series-coupled flip-flops greater than three. In the example of FIG. 1, the flip-flops are for example of type D. In the rest of the disclosure, examples are described in which the flip-flops are enabled by rising edges. However, those skilled in the art will be capable of adapting the teachings of the disclosure to flip-flops enabled by falling edges. By the terms "series-coupled", there is meant that the output of a flip-flop, noted Q, is coupled to the data input, D, of the next flip-flop in the series. Those skilled in the art will also be capable of adapting the circuit by considering an output $\overline{Q}$ of the flip-flops, the output $\overline{Q}$ of a flip-flop corresponding to the binary complement of the Q output of this flip-flop. The data input D of the first flip-flop SR1_FLIP_FLOP_1 in the series of flip-flops is, for example, powered with a voltage in the high state, noted '1'.

The clock signal input of the first shift register 110 is coupled, for example, to the clock input, CK, of each of the flip-flops in the series.

The output signal of each of the flip-flops is, for example, coupled to a multiplexer 120 which enables to select one of the Q output signals of the flip-flops to form an output signal SR1_OUTPUT of shift register 110. In the example of FIG. 1, the rising edge of the output signal selected by multiplexer 120 forms the rising edge of the time sequence to be obtained. Multiplexer 120 is, for example, controlled by a signal SEL2 generated by control unit CMD. This enables to generate easily-adjustable time sequences. In other embodiments, multiplexer 120 is omitted.

In certain embodiments, the output signal of the first flip-flop, noted S1FP1Q, is directed towards a secondary circuit 122.

The reset inputs (RESET), noted R, of each of flip-flops SR1_FLIP_FLOP_1, SR1_FLIP_FLOP_2, SR1_FLIP_FLOP_3 are, for example, controlled by control unit CMD. Control unit CMD is for example configured to control these reset inputs so that the resetting of the flip-flops is performed before the starting of the time sequence generation cycle.

The selection of one of the clock signals with the multiplexer 104 of the circuit of FIG. 1 enables to generate an edge in a time range equal to or close to the edge of the time sequence to be obtained. Complementarily, the edge produced with the selection of the desired clock signal by multiplexer 104 is potentially shiftable by a number of clock periods at most equal to the number of flip-flops in the first shift register 110. The number of flip-flops will thus be implemented as a function of the duration of the desired time sequence. In certain embodiments, within a device, a plurality of time sequence edge generation circuits 100 are, for example, each implemented with a number of flip-flops of the first register which is the same, or which is different for at least some of the circuits with respect to the others, the number of flip-flops being for example selected to be equal to a maximum edge shift. Multiplexers 104 and/or 120 enable to program this shift to generate time sequences of different duration.

The circuit 100 of FIG. 1 enables to generate a time sequence with an edge with a smaller number of flip-flops than with other solutions. The ratio of the power to the unit area may be decreased by more than half with respect to existing solutions. Further, the example of FIG. 1 enables not to exponentially increase the design complexity with the duration of the time sequence to be generated. Indeed, generating an edge of the time sequence with an additional shift can be achieved by adding an additional circuit 100 with a number of flip-flops selected according to the desired time shift.

More particularly, in the device 100 of FIG. 1, where N is equal to 5, signals CK1 to CKN are renamed in the order of the time shift that there is between them. Thus, CK(0)=CK1, CK(1)=CK3, CK(2)=CK5, CK(3)=CK2, and CK(4)=CK4. The delay between an edge of signal CK(i) and the corresponding edge, shifted in time, of the next signal CK(i+1) then is equal to T/N, with T the period of oscillator 102. Taking as reference a time t0 corresponding, for example, to an edge, for example a rising edge, of signal CK(0), the corresponding edge of signal CK(1) is delayed by T/N seconds with respect to time t0, the corresponding edge of signal CK(2) is delayed by 2*T/N seconds with respect to time t0, the corresponding edge of signal CK(3) is delayed by 3*T/N seconds with respect to time t0, and the corresponding edge of signal CK(4) is delayed by 4*T/N seconds with respect to time t0.

Thus, with respect to the time t0 corresponding, for example, to an edge, for example rising, of signal CK(0), and, for example, to a resetting of the Q outputs of register 110, an edge, for example rising, on the Q output of flip-flop SR1_FLIP_FLOP_1 is shifted by i*T/N, with i ranging from 0 to N−1, when shift register 110 is synchronized to the signal CK(i) selected by multiplexer 104.

Further, with respect to time t0, a corresponding edge, for example rising, on the Q output of flip-flop SR1_FLIP_FLOP2 is shifted by a period T with respect to the edge on the Q output of flip-flop SR1_FLIP_FLOP1, and a corresponding edge, for example rising, on the Q output of flip-flop SR1_FLIP_FLOP3 is shifted by two periods T with respect to the edge on the Q output of flip-flop SR1_FLIP_FLOP1.

The device 100 of FIG. 1 thus enables to generate an edge with a delay relative to time t0 which is at most equal to (N−1)*T/N+(P−1)*T, with P the number of flip-flops of register 110, P being equal to 3 in the example of FIG. 1. Step T/N represents the temporal precision on this delay between time t0 and the generated edge.

As an example, for an oscillator 102 operating at a 800-MHz frequency and comprising N=5 inverting gates in series, and for a shift register 110 comprising M=3 flip-flops, the time resolution with which a given delay can be generated between a time t0 and an output edge of multiplexer 120 is equal to 250 ps. Further, for this example, the delay between time t0 and the output edge of multiplexer 120 is at most equal to $4*250.10^{-12}+2*1.25.10^{-9}=3.5$ ns.

A disadvantage of the device of FIG. 1 is that the number of flip-flops of register 110 increases with the maximum value of the delay which is desired to be achieved. For example, for a delay greater than or equal to ten times the period of oscillator 102, register 110 must be implemented with at least ten flip-flops. As a result, the device becomes bulky and consumes more energy, which is not desirable.

It could be envisaged to modify the frequency of oscillator 102. However, this is difficult to implement, in particular as concerns the frequency stability of oscillator 102 with respect to temperature variations. Further, lowering the frequency of oscillator 102 to decrease the number of flip-flops in register 110 implies decreasing the temporal precision with which delays can be generated by device 100, due to the fact that the adjustment step of a delay is equal to T/N, where T is the period of oscillator 102. Finally, a device 100 in which the frequency of oscillator 102 would be modifiable would be complex to implement.

BRIEF SUMMARY

There exists a need for a circuit for generating time sequences, preferably easily adjustable, which can be manufactured with moderate costs while limiting the power consumption and the circuit surface area.

An embodiment overcomes all or part of the disadvantages of known time sequence generation circuits.

An embodiment provides a device comprising:

- a ring oscillator comprising a plurality of inverting logic gates coupled one after the other and each delivering a fast clock signal;
- a first shift register comprising a succession of first flip-flops, preferably of type D, each synchronized to a same first clock signal corresponding to one of the fast clock signals having its frequency divided by a positive integer M, the first shift register being looped back on itself so as to implement a second oscillator in which each first flip-flop delivers a slow clock signal; and
- a second shift register comprising a single second flip-flop or a succession of second flip-flops, each second flip-flop being synchronized to the same second clock signal corresponding to one of the slow clock signals.

According to an embodiment, a data input of a first first flip-flop of the succession of first flip-flops receives a signal at least partly determined by a first binary signal equal to a logical OR between an output of a last first flip-flop of the succession of first flip-flops and a logical negation of a logical OR between outputs of at least two last first flip-flops of the succession of first flip-flops.

According to an embodiment, the signal received by the data input of the first flip-flop is equal to a logical OR between the first signal and a negation of an enable signal, or to a logical AND between the first signal and the enable signal.

According to an embodiment, the fast clock signals are shifted in time with respect to one another.

According to an embodiment, the slow clock signals are shifted in time with respect to one another.

According to an embodiment, the device comprises a first selection circuit configured to select the first clock signal from among the fast clock signal having its frequency divided by integer M and at least another of the fast clock signals.

According to an embodiment, the first selection circuit is configured to deliver the first clock signal to a synchronization input of each of the first flip-flops.

According to an embodiment, the device comprises a second selection circuit configured to select the second clock signal from among all or part of the slow clock signals.

According to an embodiment, the second selection circuit is configured to deliver the second clock signal to a synchronization input of each of the second flip-flops.

According to an embodiment, the device comprises a third shift register comprising a single third flip-flop or a succession of third flip-flops, preferably of type D, each third flip-flop being synchronized to a same third clock signal corresponding to one of the fast clock signals.

According to an embodiment, the device comprises a third selection circuit configured to receive all or part of the fast clock signals, and to deliver the third clock signal to a synchronization input of each third flip-flop.

According to an embodiment, a data input of the third shift register receives a signal determined by an output of the second shift register.

According to an embodiment, the second shift register comprises the succession of second flip-flops, and the device comprises a fourth selection circuit configured to select an output signal of one of the second flip-flops from among all or part of the output signals of the second flip-flops, and to deliver the selected signal to the data input of the third shift register.

According to an embodiment, an output of the third register is an output of the single third flip-flop or of one of the third flip-flops of the succession of third flip-flops, for example, selected by a selection circuit from among all or part of the outputs of the third flip-flops of the succession of third flip-flops.

According to an embodiment, the device comprises a circuit configured to:

control the setting of the flip-flops; and/or control an enabling of the first oscillator.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as "front", "back", "top", "bottom", "left", "right", etc., or relative position qualifiers, such as "top", "bottom", "upper", "lower", etc., or orientation qualifiers, such as "horizontal", "vertical", etc., reference is made unless otherwise specified to the orientation of the drawings or to a . . . in a normal position of use.

Unless specified otherwise, the expressions "about", "approximately", "substantially", and "in the order of" signify plus or minus 10% or 10°, preferably of plus or minus 5% or 5°.

Figure 1:
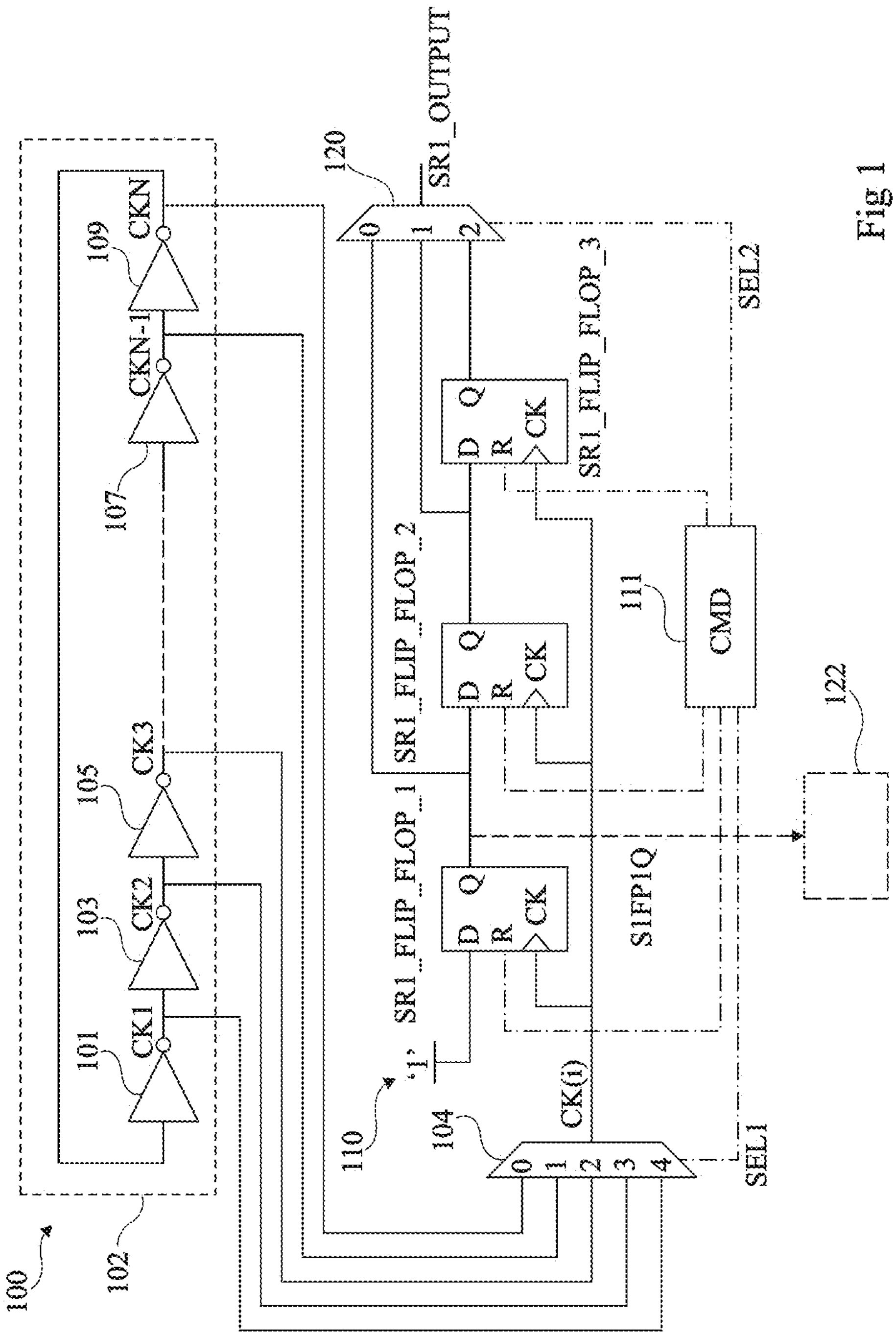
FIG. 1, described hereabove, is a copy of FIG. 1 of the above-mentioned patent applications.

To overcome the disadvantages of a time sequence generation circuit of the type of that of FIG. 1, there is here provided a circuit for generating a time sequence, for example a delay between an initial time of the sequence and the first edge of the time sequence. The provided circuit comprises a ring oscillator similar to that of the device 100 of FIG. 1, a first shift register looped back on itself so as to implement an oscillator, and a second shift register. The first shift register is synchronized to a fast clock signal delivered by one of the inverting logic gates of the ring oscillator. The second shift register is synchronized to a clock signal slow with respect to the fast clock signal, this slow clock signal being delivered by one of the flip-flops of the first shift register.

Preferably, a third shift register has a data input coupled to an output of the second shift register, and is synchronized to a fast clock signal delivered by one of the inverting logic gates of the ring oscillator.

In such a device, the fast clock signals delivered by the logic gates of the oscillator allow a delay adjustment precision equal to Tf/Nf, with Tf the period of the ring oscillator and Nf the number of inverting logic gates in series in the ring oscillator. Further, the first shift register configured as an oscillator generates slow clock signals with a period equal to Ts=Ns*Tf, with Ns the number of flip-flops in series in the first shift register. Thus, the second shift register enables to generate a delay having a maximum value equal to (Nd1−1)*Ts+(Ns−1)*(Ts/Ns), with Nd1 the number of flip-flops of the second shift register, with a temporal precision equal to Ts/Ns, and thus to Tf.

Preferably, when the device comprises the third shift register, the device enables to generate a delay corresponding to the sum of a first delay provided by the second shift register, and a second delay provided by the third shift register and starting from the end of the first delay. In this case, the precision of the delay generated by the device is equal to Tf/Nf. Further, the delay generated by the device has a maximum value at least equal to (Nd1−1)*Ts+(Ns−1)*(Ts/Ns)+(Nd2−1)*Tf, with Nd2 the number of flip-flops in the third shift register.

Figure 2:
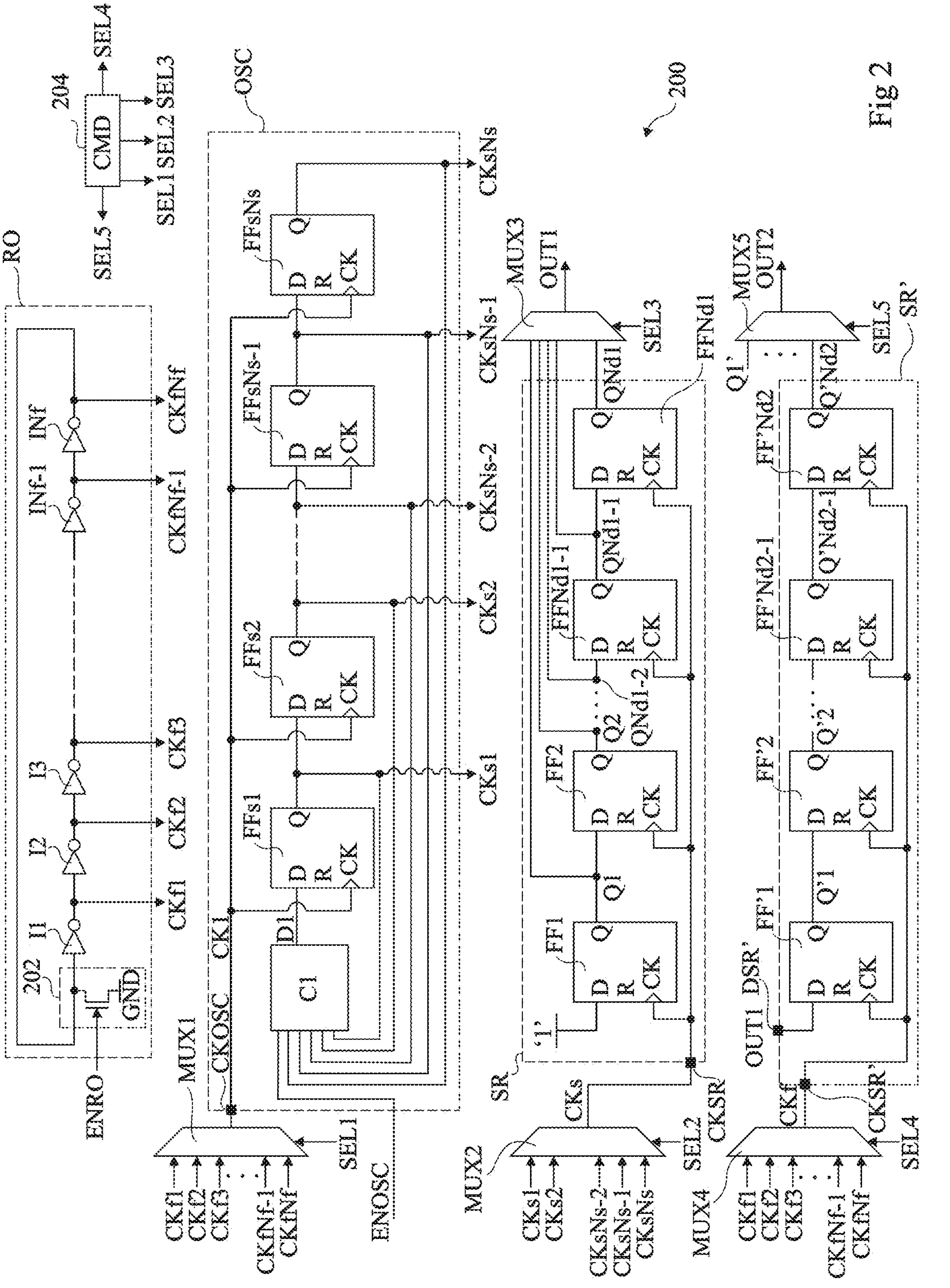
FIG. 2 shows an example of embodiment of a time sequence generation device.

FIG. 2 shows an example of an embodiment of such a time sequence generation circuit or device 200.

Device 200 comprises a ring oscillator RO. Ring oscillator RO is formed of a plurality of inverting logic gates Ii, with i an index from 1 to Nf and Nf an odd integer greater than or equal to 3. Logic gates Ii (I1, I2, I3, . . . , INf−1, and INf in FIG. 2) are coupled in series, or, in other words, one after the other, for example by order of increasing index i in the example of FIG. 2. The output of logic gate INf is coupled, for example connected, to the input of logic gate I1. In other words, the input of the first logic gate I1 of the series connection of the Nf gates Ii is coupled, for example connected, to the output of the last logic gate INf of the series connection of the Nf gates Ii.

For example, in FIG. 2, the output of gate INf is coupled to the input of gate I1 by a circuit 202 configured to selectively enable and disable oscillator RO as a function of the state of a control signal ENRO. For example, this circuit 202 comprises a transistor coupling to ground GND the output of gate INf, which is connected to the input of gate I1, this transistor being controlled by signal ENRO. As an example, signal ENRO is delivered by a control circuit, for example by a control circuit 204 shown in the form of a block CMD in FIG. 2.

In another example, not shown, circuit 202 is omitted. The output of gate INf is then, for example, connected to the input of gate In1.

Logic gates Ii deliver respective output signals CKfi (CKf1, CKf2, CKf3, . . . , CKfNf−1, CKfNf in FIG. 2). Signals CKfi are fast clock signals. Fast clock signals CKfi have, similarly to the clock signals CK1 to CKN of FIG. 1, edges exhibiting time shifts with respect to one another. In the example of FIG. 2, the considered edges are rising edges. Those skilled in the art will be capable of adapting the description to the case where the considered edges are falling edges.

In the example of FIG. 2, logic gates Ii are, for example, inverters. It is however possible for oscillator RO to be formed based on other types of logic gates Ii, such as NOR-type gates Ii or NAND-type gates Ii.

Device 200 further comprises a shift register OSC configured as an oscillator. Oscillator OCS comprises a number Ns of D flip-flops FFsj (FFs1, FFs2, FFsNs−1, and FFsNs in FIG. 2), where j is an integer ranging from 1 to Nf, and Nf an integer greater than or equal to 1, for example greater than or equal to 3. The flip-flops FFsj are coupled in series, that is, one after the other, r example by order of increasing index j in FIG. 2.

By the terms "series-coupled", there is meant that the output of a flip-flop, Q, is coupled to the data input, noted D, of the next flip-flop in the series. In the example of FIG. 2, the Q output of a flip-flop is connected to the D data input of the next flip-flop in the series. In another example, each flip-flop has its Q output coupled to the D input of the next flip-flop by a circuit introducing a delay, to avoid metastability problems in register OSC.

Each flip-flop FFsj delivers on its Q output a signal CKsj (CKs1, CKs2, . . . , CKsNs−2, CKsNS−1, and CKsNs in FIG. 2).

Each flip-flop FFsj has a synchronization input, noted CK in FIG. 2, receiving a same clock signal CK1. For example, register OSC has a synchronization input CKOSC configured to receive signal CK1, input CKOSC being coupled, preferably connected, to the CK input of each flip-flop FFsj. In the rest of the disclosure, examples are described in which the flip-flops are enabled by rising edges. However, those skilled in the art will be capable of adapting the teachings of the disclosure to flip-flops enabled by falling edges. Those skilled in the art will also be capable of adapting the circuit considering a $\overline{Q}$ output of the flip-flops, the $\overline{Q}$ output of a flip-flop corresponding to the binary complement of the Q output of this flip-flop.

According to an embodiment, signal CK1 corresponds to one of the fast clock signals CKfi.

For example, device 200 comprises a selection circuit MUX1, for example a multiplexer, configured to receive all or part of the signals CKfi and to select, based on a control signal SEL1, signal CK1 from among the received signals CKfi. As an example, signal SEL1 is delivered by a control circuit, for example circuit 204.

As an alternative example, circuit MUX1 is omitted, and the CKOSC input of oscillator OSC is connected to the output of the gate Ii delivering the signal CKfi having signal CK1 corresponding thereto.

Preferably, signal CK1 corresponds to signal CKf1.

Further, shift register OCS is looped back on itself so that it operates as an oscillator. More particularly, register OSC is configured to emulate an oscillator operating at a frequency Fs=1/(Tf*Ns), that is, at a frequency Ns times slower than the frequency of oscillator RO. Thus, the signals CKsj are clock signals slower than the fast clock signals CKfi.

In a non-illustrated example, the Q output of flip-flop FFsNs is coupled to the D input of flip-flop FFs1 by an inverter. For example, this inverter receives signal CKsNs and delivers a signal D1 which is applied, that is, delivered, to the D input of flip-flop FFs1.

In the example of FIG. 2, the Q output of flip-flop FFsNs is delivered to a combinational logic circuit C1, configured to deliver a signal D1 to the D input of flip-flop FFs1.

More particularly, in the example of FIG. 2, circuit C1 receives a signal ENOSC enabling to selectively enable and disable oscillator OSC, and all or part of signals CKsj.

For example, when the high level of the signals CKsj and ENOSC corresponds to a logical '1', signal D1 is equal to a logical OR between:

- signal CKsNs;
- a logical negation (or complement) of a logical OR of the signals CKsj of the last Ns-K flip-flops in the series; and
- a negation (or complement) of signal ENOSC when signal ENOSC is configured to set all signals CKsj to '1' if ENOSC is in the low state corresponding to the logical '0'.

As another example, when the high level of the signals Cksj and ENOSC corresponds to a logical '1', signal D1 is equal to a logical AND between:

- signal ENOSC; and
- a logical OR between:
- signal CKsNs; and
- a logical negation (or complement) of a logical OR of the signals CKsj of the last Ns-K flip-flops in the series. In this example, signal ENOSC is configured to set all logic signals CKsj to '1' if ENOSC is in the low state corresponding to the logical '0'.

In another example, circuit C1 does not receive signal ENOSC, and when the high level of the signals CKsj corresponds to a logical '1', signal D1 is equal to a logic OR between:

- signal CKsNs;
- a logical negation (or complement) of a logical OR of the signals CKsj of the last Ns-K flip-flops in the series.

In the last three above-described examples, K is an integer in the range from 1 to Ns−1 and the signals CKsj have the same duty cycle equal to K/Ns.

Similarly to the fast clock signals CKj, the slow clock signals CKsj have edges, for example rising in the example of FIG. 2, which are shifted in time. The shift between two corresponding edges of two respective signals CKsj and CKj+1 is equal to the period of signal CK1, that is, to the period Tf of oscillator RO. For example, as compared with an edge of signal CKs1, the corresponding edge of signal CKs2 is delayed by one period of signal CK1, the corresponding edge of signal CKs3 is delayed by two periods of signal CK1, etc.

Although this is not shown in FIG. 2, the reset inputs, noted R, of the flip-flops FFsj all receive a same control signal, for example delivered by a control circuit, for example by circuit 204.

As an example, when oscillator OSC is set, or reset, before a rising edge of one of signals CKfi, this rising edge may be the initial time of a delay Del1 to be generated in the time sequence to be produced. As compared with this initial time, according to the signal CKfi used as signal CK1, a rising edge on output CKs1 of flip-flop FF1 will arrive with delay Del11 equal to q*Tf/Nf, with q an integer between 0 and Nf−1 and determined by the signal CKfi used as signal CK1. Further, as compared with this rising edge of signal CKs1, a corresponding rising edge on signal CKsj will arrive with a delay Del12 equal to (j−1)*Tf. In other words, the selection of signal CK1 from among the signals CKfi and of one of the output signals CKsj enables to produce a Del1 delay having any value equal to Del11+Del12, that is, equal to q*Tf/Nf+(j−1)*Tf. In practice, the above operation is similar to the operation of the device of FIG. 1.

Device 200 further comprises a shift register SR. This shift register is similar to the shift register 110 of FIG. 1, with the difference that its synchronization input CLKSR receives a clock signal CKs corresponding to one of the slow clock signals CKsj.

For example, device 200 comprises a selection circuit MUX2, for example a multiplexer, configured to receive all or part of the signals CKsj and to select, based on a control signal SEL2, signal CKs from the received signals CKsj. As an example, signal SEL2 is delivered by a control circuit, for example circuit 204.

As an alternative example, circuit MUX2 is omitted, and input CKSR of register SR is connected to the output of the flip-flop FFsj delivering the signal CKsj having signal CKs corresponding thereto.

Register SR comprises a number Nd1 of D type flip-flops FF1, with 1 an integer index ranging from 1 to Nd1 and Nd1 a positive integer. In the example of FIG. 2, Nd1 is greater than 1, although in other examples not shown, Nd1 may be equal to 1. The flip-flops FF1 (FF1, FF2, FFNd1−1, FFNd1 in FIG. 2) are coupled in series, that is, one after the other, for example by order of increasing index 1 in FIG. 2.

The definition of the terms "series-coupled" given hereabove applies to the flip-flops FF1 of shift register SR. In the example of FIG. 2, each flip-flop FF1 has its Q output connected to the D input of the next flip-flop FF1+1 in the series. In another example, each flip-flop FF1 has its Q output coupled to the D input of the next flip-flop FF1+1 by a circuit introducing a delay, to avoid metastability problems in shift register SR.

Each flip-flop FF1 delivers on its Q output a signal Q1 (Q1, Q2, QNd1−2, QNd1−1, and QNd1 in FIG. 2).

Each flip-flop FF1 has a synchronization input, noted CK in FIG. 2, receiving clock signal CKs. For example, input CKSR is coupled, preferably connected, to the CK input of each flip-flop FF1. In the rest of the disclosure, examples are described in which the flip-flops are enabled by rising edges. However, those skilled in the art will be capable of adapting the teachings of the disclosure to flip-flops enabled by falling edges. Those skilled in the art will also be capable of adapting the circuit by considering a $\bar{Q}$ output of the flip-flops, the $\bar{Q}$ output of a flip-flop corresponding to the binary complement of the Q output of this flip-flop.

The D data input of the first flip-flop FF1 in the series of flip-flops is, for example, powered with a high voltage, corresponding for example to a logic state '1', in this example where the considered edges are rising edges.

The reset inputs (R) of flip-flops FF1 all receive the same control signal, for example delivered by a control circuit, for example circuit 204. This control signal is, for example, configured so that the resetting of flip-flops FF1 is performed before the starting of the time sequence generation cycle.

As an example, when register SR is, for example, set, or reset, before a rising edge of one of signals CKsj, this rising edge may be the initial time of a delay Del2 to be generated in the time sequence to be produced. Depending on the signal CKsj used as signal CKs, with respect to the initial time of delay Del2, a rising edge on the output Q1 of flip-flop FF1 will arrive with delay Del21 equal to o*Ts/Ns=o*Tf, with o an integer in the range from 0 to Ns−1 and determined by the signal CKsj used as signal CKs. Further, with respect to this rising edge of signal Q1, a corresponding rising edge on signal Qp, with p an integer from 1 to Nd1, will arrive with a delay Del22 equal to (p−1)*Ts. In other words, the selection of signal CKs from among signals CKsj and of one of output signals Q1 enables to produce a delay Del2 having any value equal to Del21+Del22, that is, o*(Ts/Ns)+(p−1)*Ts.

As a complementary example, it is possible to produce, with respect to an initial time corresponding to the initial time of delay Del1, a delay Del3 equal to the sum of delays Del1 and Del2, for example by providing for delay Del2 to start at the end of delay Del1. Del3 delay will have an adjustment step equal to Tf/Ns.

More generally, device 200 enables to produce delays between two edges of a time sequence to be generated, by first dividing a delay to be produced into a number of periods Ts of oscillator OSC, then dividing a remaining duration into a number of periods Tf of oscillator RO, and then dividing a remaining duration into a number of fine-adjustment steps Tf/Nf. In other words, a delay to be produced may be broken down into a sum of a number of periods Ts, of a number of periods Tf, and of a number of fine-adjustment steps Tf/Nf. This differs from the device of FIG. 1, where a delay to be produced was broken down only into a sum of a number of periods of an oscillator 102 (corresponding to oscillator RO in the device of FIG. 2) and of a number of fine-adjustment steps T/N (equivalent to Tf/Nf in the device of FIG. 2).

Further, to generate a delay greater than or equal to 10 times the period of the oscillator 102 of FIG. 1, or RO of the drawing, device 200 needs a smaller number of flip-flops than the device of FIG. 1, while keeping the same adjustment precision, that is, the same time resolution. Device 200 thus has a lower bulk than a corresponding device 100. Further, due to the fact that the flip-flops of registers OSC and SR switch at a lower frequency than the flip-flops of device 100, device 200 also has power consumption lower than that of an equivalent device 100.

As a comparative example, there is considered a device 100 in which N=5 and T=1.25 ns. In this case, the time resolution of the delays generated with device 100 is equal to T/N=1.25/5=250 ps. To generate a delay of 12.5 ns, which is thus equal to 10 times the period T of oscillator 102, register 110 will have to comprise a succession of at least ten flip-flops in series. There is now considered the device 200 of FIG. 2, where Nf=5 and Tf=1.25 ns. In this case, as with device 100, the time resolution on the delays generated by device 200 is equal to Tf/Nf=250 ps. However, to generate a delay of 12.5 ns in the case where, as an example, register OSC has Ns=5 flip-flops and thus operates at a period Ts=Ns*Tf=6.25 ns, Nd1=2 flip-flops are sufficient in register SR. Device 200 may then comprise 3 flip-flops less than device 100.

The output signal OUT1 of register SR corresponds to one of the output signals Q1 of flip-flops FF1.

In the example of FIG. 2, the output signals Q1 of flip-flops FF1 are, for example, coupled to a selection circuit MUX3, for example, a multiplexer. Multiplexer MUX3 is configured to select, based on a control signal SEL3, one of the signals Q1 that it receives to form an output signal OUT1 of shift register SR. As an example, signal SEL2 is delivered by a control circuit, for example circuit 204. The provision of circuit MUX3 enables to adjust the delay ending with an edge on signal OUT1.

In other non-illustrated examples, circuit MUX3 is omitted, and the output of the register SR on which signal OUT1 is available is directly connected to the output of one of flip-flops FF1.

In the embodiment of FIG. 2, device 200 further comprises a shift register SR'. Shift register SR' is synchronized to a clock signal CKf corresponding to one of fast clock signals CKfi. A synchronization input CKSR' of register SR' receives signal CKf.

For example, device 200 comprises a selection circuit MUX4, for example a multiplexer, configured to receive all or part of signals CKfi and to select, based on a control signal SEL4, signal CKf from the received signals CKfi. Circuit MUX4 delivers the selected signal CKf to input CKSR' of register SR'. As an example, signal SEL4 is delivered by a control circuit, for example circuit 204.

As an alternative example, circuit MUX4 is omitted, and the input CKSR' of register SR' is connected to the output of the gate Ii delivering the signal CKfi having signal CKf corresponding thereto.

Shift register SR' comprises a number Nd2 of D-type flip-flops FF'u, with u an integer index ranging from 1 to Nd2 and Nd2 a positive integer. In the example of FIG. 2, Nd2 is greater than 1, although in other examples not shown, Nd2 may be equal to 1. The flip-flops FF'u (FF'1, FF'2, FF'Nd2−1, FF'Nd2 in FIG. 2) are coupled in series, that is, one after the other, for example by order of increasing index u in FIG. 2.

The definition of the terms "series-coupled" given hereabove applies to the flip-flops FF'u of shift register SR'. In the example of FIG. 2, each flip-flop FF'u has its Q output connected to the D input of the next flip-flop FF'u+1 in the series. In another example, each flip-flop FF'u has its Q output coupled to the D input of the next flip-flop FF'u+1 by a circuit introducing a delay, to avoid metastability problems in shift register SR'.

Each flip-flop FF'u delivers on its Q output a signal Q'u (Q'1, Q'2, Q'Nd2−1, and Q'Nd2 in FIG. 2).

Each flip-flop FF'u has a synchronization input, noted CK in FIG. 2, receiving clock signal CKf. For example, input CKSR' is coupled, preferably connected, to the CK input of each flip-flop FF'u. In the rest of the disclosure, examples are described in which the flip-flops are enabled by rising edges. However, those skilled in the art will be capable of adapting the teachings of the disclosure to flip-flops enabled by falling edges. Those skilled in the art will also be capable of adapting the circuit by considering a $\overline{\mathbb{Q}}$ output of the flip-flops, the $\overline{\mathbb{Q}}$ output of a flip-flop corresponding to the binary complement of the Q output of this flip-flop.

The D data input of the first flip-flop FF'1 in the series of flip-flops FF'u is coupled, for example connected, to a data input DSR' of register RS', input DSR' receiving the output signal OUT1 from register SR. In the example shown in FIG. 2, the D input of flip-flop FF'1 is connected to the input DSR' of the register, and thus receives signal OUT1.

The reset inputs, noted R, of the flip-flops FF'u all receive a same control signal, for example from a control circuit, for example by circuit 204.

Register SR' delivers an output signal OUT2, for example corresponding to an output signal of device 200.

As an example, register SR' is configured to generate an edge on signal OUT2 of the register with a delay Del4 with respect to an edge on the output signal OUT1 of register SR, this edge on output OUT1 forming the initial time of delay Del4. As an example, register SR' is reset before this initial time of delay Del4. The initial time of delay Del4 is synchronized to signal CKs, itself synchronized to the CK1 signal corresponding to one of signals CKfi. In this example, according to the signal CKfi used as signal CKf, a rising edge on the output Q'1 of flip-flop FF'1 will arrive with a delay Del41, equal to k*Tf/Nf, with k an integer in the range from 0 to Nf−1 and determined by the signals CKfi used as signals CK1 and CKs respectively. Further, with respect to this rising edge of signal Q'1, a corresponding rising edge on signal Q'u will arrive with a delay Del42 equal to (u−1)*Tf. In other words, the selection of signal CKf from among signals CKfi and of one of the output signals Q'u as a signal OUT2 produces a delay Del4 having any value equal to Del41+Del42, that is, equal to k*Tf/Nf+(u−1)*Tf.

In practice, the above operation of register SR' to generate a delay Del4 between an edge on signal OUT1 and an edge on signal OUT2 is similar to the operation of the register 122 of the device of FIG. 1 to generate a delay between an edge on the output SR1_OUTPUT of register 104 and an edge on an output of another shift register forming part of circuit 122. The methodology described in patent applications FR 3133458, US2023291396, and CN 116760392 applies to select signal Ckf from among signals CKfi and an output signal OUT2 from among signals Q'u so as to implement a delay Del4 between an edge on signal OUT1 and an edge on signal OUT2. In particular, those skilled in the art will be capable of avoiding possible metastability problems, for example by selecting signal CKf based on the method described in relation with FIGS. 4, 5*a*, 5*b*, and 5*c* of the above-mentioned applications.

In the example of FIG. 2, the output signals Q'u of flip-flops FF'u are, for example, coupled to a selection circuit MUX5, for example a multiplexer. Multiplexer MUX5 is configured to select, based on a control signal SEL5, one of the signals Q'u that it receives to form the output signal OUT2 of shift register SR'. As an example, signal SEL5 is delivered by a control circuit, for example circuit 204. The provision of circuit MUX5 enables to adjust the delay ending with an edge on signal OUT2.

In other non-illustrated examples, circuit MUX5 is omitted, and the output of the register SR' on which signal OUT2 is available is directly connected to the output of one of flip-flops FF'u.

Returning to the example of calculation of delays Del1 and Del3, when the initial time of delay Del1 is synchronized to an edge of signal CK1, delay Del11 has a zero value, and delay Del1 then has a value equal to 0+Del12, that is, equal to (j−1)*Tf. As a result, delay Del3 has a time resolution equal to Tf, and no longer to Tf/Nf. The provision of register then enables to generate a delay Del3' between the initial time of delay Del1 and an edge on output OUT2 marking the end of delay Del3', which has a value equal to Del3+Del4 and which thus has a time resolution equal to Tf/Nf.

As a comparative example, there is considered a device 100 in which N=5 and T=1.25 ns. To generate a delay of 12.5 ns, which is thus equal to 10 times the period T of oscillator 102, register 110 will have to comprise a succession of at least ten flip-flops in series. There is now considered the device 200 of FIG. 2, where Nf=5, Tf=1.25 ns, Ns=5, CK1=CKf1, and CKs=CKs5. In this case, it is sufficient for Nd1 to be equal to 2, for Nd2 to be equal to 1, for OUT1=Q2, for CKf=CK4, and for OUT2=Q'1 to generate a delay of 12.5 ns between an edge of signal CK1 and an edge of signal OUT2, with a resolution of Tf/Nf. Device 200 may then comprise 2 flip-flops less than device 100.

Examples of embodiments have been described hereabove, in which register SR' is synchronized to a signal CKf corresponding to one of the fast clock signals CKfi. In other embodiments, register SR' may be synchronized to a clock signal corresponding to one of the slow clock signals CKsj.

Further, time sequences comprising more edges may be produced by adding shift registers one after the other in the same way as register SR' follows register SR, each of these additional registers being synchronized to a respective clock signal corresponding to one of the slow clock signals CKsj or one of the fast clock signals CKfi.

Further, examples of embodiments in which signal CK1 corresponds to one of the fast clock signals CKfi have been described hereabove. In alternative embodiments, to generate longer delays in a time sequence, it may be provided for signal CK1 to correspond to one of the signals CKfi having previously seen its frequency divided by a positive integer M. Indeed, in this case, the period of oscillator OSC is multiplied by M. It should be noted that the case where M is equal to 1 amounts to having signal CK1 correspond to one of the fast clock signals CKfi, as in the case of the above-described examples.

Further, as previously indicated, although the examples of sequences and of delays produced with device 200 have been described with reference to rising edges, those skilled in the art will be capable, based on the present disclosure, to produce with device 200 delays and/or time sequences between rising edges and falling edges, or between falling edges only. For example, in the case where the edge of interest generated at the output OUT of register SR is a falling edge, the first flip-flop FF1 of register SR may have its D data input receiving a voltage in the low state, corresponding for example to a logic state ‘0’.

In particular, although this has not been indicated in relation with the description made hereabove of oscillator OSC, the provision of a given duty cycle K/Ns is advantageous when the time sequence produced by device 200 is a sequence between rising edges and falling edges, which is, for example, the case when the produced sequence is a sequence of control of a power device configured to deliver an average power equal to a set point value.

As an example, device 200 may be used to produce control sequences for power devices or memories, for example in electronic systems corresponding to power applications, for example, industrial, and/or to applications in the field of transport, and/or to applications of Internet of Things (IoT) type.

Various embodiments and variants have been described. Those skilled in the art will understand that certain features of these various embodiments and variants may be combined, and other variants will occur to those skilled in the art. In particular, the signals generated at the output of one or a plurality of registers controlled by oscillators RO and OSC in device 200 may be recombined with logic gates to construct more complex signals. Further, in examples not shown, circuit MUX1 may receive only part of signals CKfi and/or circuit MUX2 may receive only part of signals CKsj and/or circuit MUX3 may receive only part of signals Q1 and/or circuit MUX4 may receive only part of signals CKfi and/or circuit MUX5 may receive only part of signals Q'u. Conversely, in other examples, circuit MUX2 may receive, in addition to one or a plurality of signals CKsj, all or part of signals Ckfi and/or circuit MUX4 may receive, in addition to one or a plurality of signals CKfi, all or part of signals CKsj. In other words, in these other examples, signal CKs is selected from among all or part of signals CKfi and all or part of signals CKsj, and/or signal CKf is selected from among all or part of signals CKfi and all or part of signals CKsj.

Finally, the practical implementation of the described embodiments and variants is within the abilities of those skilled in the art based on the functional indications given hereabove. In particular, those skilled in the art will be capable, based on the functional description given hereabove, of implementing the steps of resetting of oscillators RO and OSC and of registers SR and SR' according to a time sequence to be generated, to obtain the above-described operation, that is, the generation of a delay broken down into a number of periods Ts, a number of periods Tf, and a number of steps Tf/Nf. As an example, these resets of the various elements RO, OSC, SR, and SR' of the device are controlled by circuit 204.

The invention claimed is:

1. A device comprising:

a ring oscillator comprising a plurality of inverting logic gates coupled one after the other and each delivering a fast clock signal;

a first shift register comprising a succession of first flip-flops, each synchronized to a same first clock signal corresponding to one of the fast clock signals having its frequency divided by a positive integer M, the first shift register being looped back on itself so as to implement a second oscillator in which each first flip-flop delivers a slow clock signal; and a second shift register comprising a single second flip-flop or a succession of second flip-flops, each second flip-flop being synchronized to a same second clock signal corresponding to one of the slow clock signals.

2. The device according to claim 1, wherein a data input of a first flip-flop of the succession of first flip-flops receives a signal at least partly determined by a first binary signal equal to a logical OR between an output of a last first flip-flop of the succession of first flip-flops and a logical negation of a logical OR between outputs of at least two last first flip-flops of the succession of first flip-flops.

3. The device according to claim 2, wherein the signal received by the data input of the first flip-flop is equal to a logical OR between the first signal and a negation of an enable signal, or to a logical AND between the first binary signal and the enable signal.

4. The device according to claim 1, wherein the fast clock signals are shifted in time with respect to one another.

5. The device according to claim 1, wherein the slow clock signals are shifted in time with respect to one another.

6. The device according to claim 1, further comprising a first selection circuit configured to select the first clock signal from among the fast clock signal having its frequency divided by integer M and at least another of the fast clock signals.

7. The device according to claim 6, wherein the first selection circuit is configured to deliver the first clock signal to a synchronization input of each of the first flip-flops.

8. The device according to claim 1, further comprising a second selection circuit configured to select the second clock signal from among all or part of the slow clock signals.

9. The device according to claim 8, wherein the second selection circuit is configured to deliver the second clock signal to a synchronization input of each of the second flip-flops.

10. The device according to claim 1, further comprising a third shift register comprising a single third flip-flop or a succession of third flip-flops, preferably of type D, each third flip-flop being synchronized to a same third clock signal corresponding to one of the fast clock signals.

11. The device according to claim 10, further comprising a third selection circuit configured to receive all or part of the fast clock signals, and to deliver the third clock signal to a synchronization input of each third flip-flop.

12. The device according to claim 10, wherein a data input of the third shift register receives a signal determined by an output of the second shift register.

13. The device according to claim 12, wherein the second shift register comprises the succession of second flip-flops, and the device further comprises a fourth selection circuit configured to select an output signal of one of the second flip-flops from among all or part of the output signals of the second flip-flops, and to deliver the selected signal to the data input of the third shift register.

14. The device according to claim 10, wherein an output of the third register is an output of the single third flip-flop or of one of the third flip-flops of the succession of third flip-flops, selected by a selection circuit from among all or part of the outputs of the third flip-flops of the succession of third flip-flops.

15. The device according to claim 1, further comprising a circuit configured to:

control the setting of the first and second flip-flops; and/or control an enabling of the ring oscillator.

* * * * *